(12) United States Patent
Gwin et al.

(10) Patent No.: US 9,867,276 B2
(45) Date of Patent: Jan. 9, 2018

(54) ELECTRONIC DEVICE

(71) Applicant: Intel Corporation, Santa Clara, CA (US)

(72) Inventors: Paul J. Gwin, Orangevale, CA (US); Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 14/865,291

(22) Filed: Sep. 25, 2015

(65) Prior Publication Data

US 2017/0094772 A1    Mar. 30, 2017

(51) Int. Cl.
*H05K 5/00* (2006.01)
*H05K 1/02* (2006.01)
*G06F 1/18* (2006.01)
*G06F 1/20* (2006.01)

(52) U.S. Cl.
CPC ........... *H05K 1/0204* (2013.01); *G06F 1/181* (2013.01); *G06F 1/203* (2013.01)

(58) Field of Classification Search
USPC .................................................. 361/752, 748
See application file for complete search history.

(56) References Cited

U.S. PATENT DOCUMENTS

| | | | |
|---|---|---|---|
| 6,178,094 B1* | 1/2001 | Hakozaki | H05K 7/1418 16/95 R |
| 2006/0268528 A1* | 11/2006 | Zadesky | H04M 1/026 361/728 |

* cited by examiner

*Primary Examiner* — Andargie M Aychillhum
(74) *Attorney, Agent, or Firm* — Alpine Technology Law Group LLC

(57) ABSTRACT

Electronic device and housing for such devices are described and claimed. In one example a housing comprises a first end cap dimensioned to fit within a first open end of the housing and comprising a first bracket having a first cam surface positioned to engage the second surface of the printed circuit board when the first end cap is inserted into the first open end of the housing. Inserting the first end cap into the first open end of the housing causes the first cam surface to urge the printed circuit board in a direction which compresses the first heat generating component against an interior surface of the housing.

19 Claims, 8 Drawing Sheets

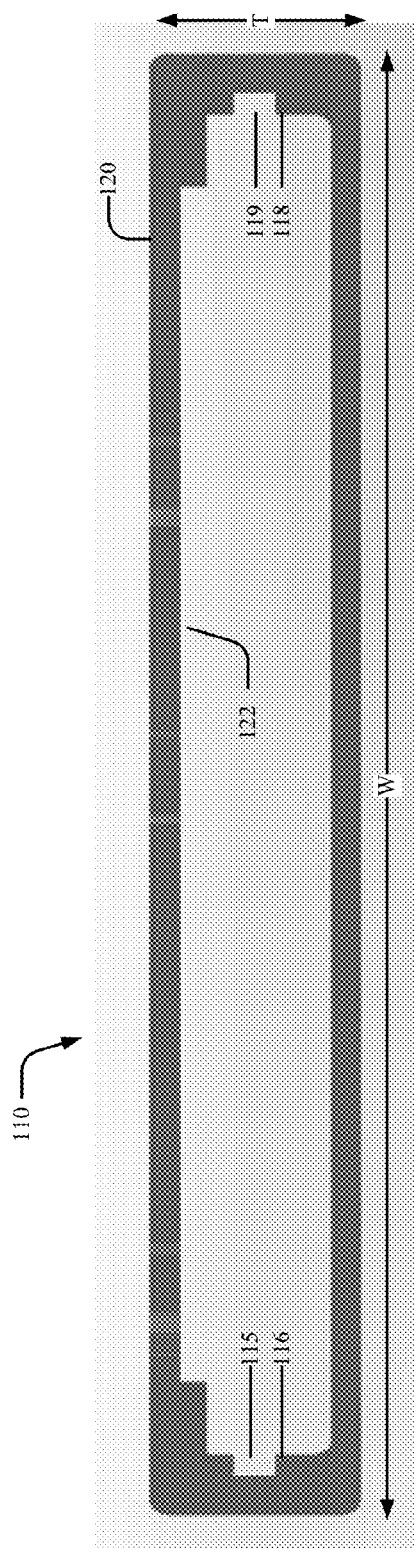
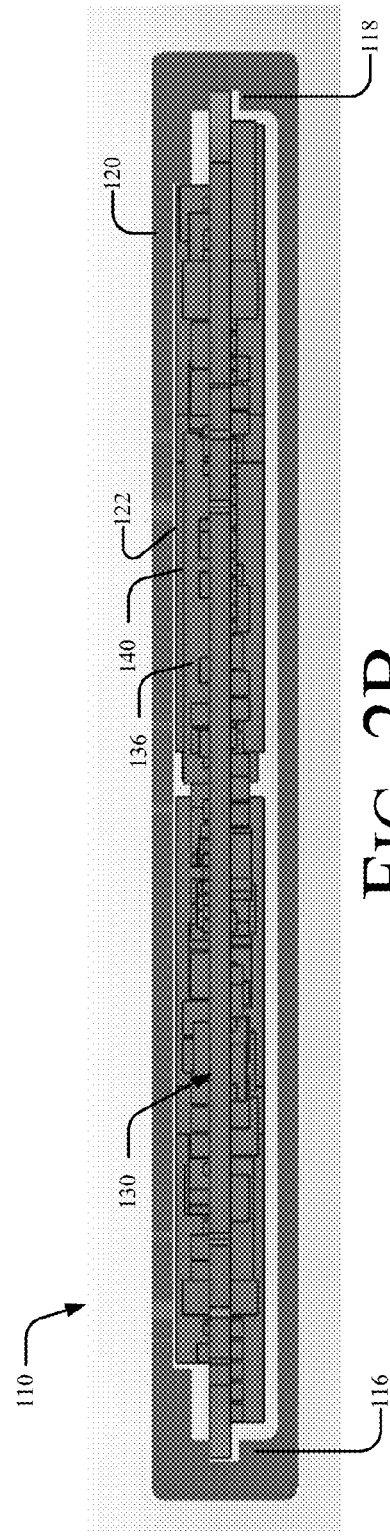
FIG. 2A
FIG. 2B

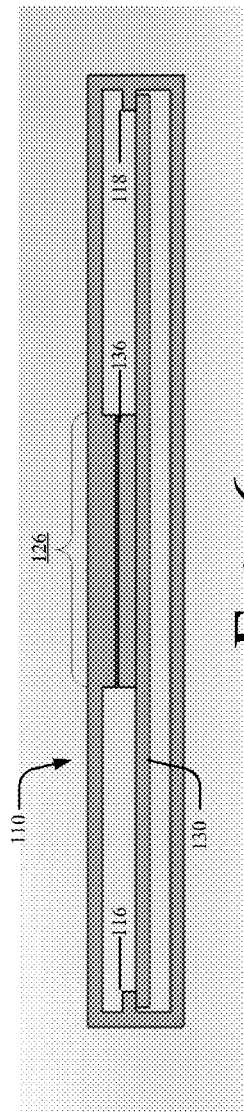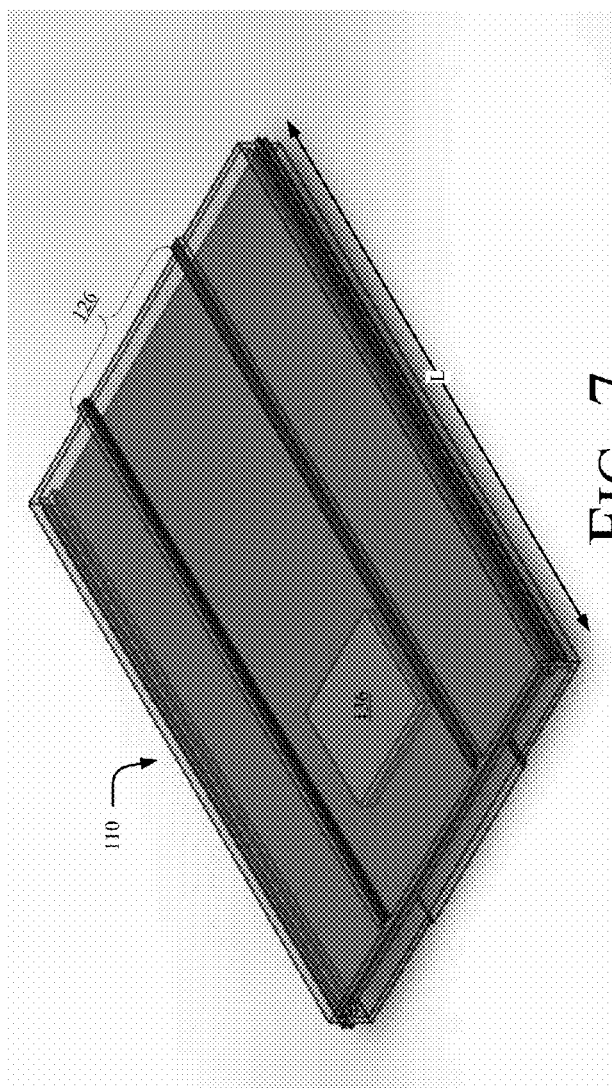

US 9,867,276 B2

ELECTRONIC DEVICE

FIELD

The present disclosure generally relates to the field of electronics. More particularly, aspects generally relate to electronic devices and housings for electronic devices.

BACKGROUND

Electronic devices commonly include one or more heat generating devices, e.g., integrated circuits, mounted on a printed circuit board and enclosed in a housing. Thin form-factor electronic devices such as solid state drives (SSDs), mobile phones, tablet computers, and the like rely on conduction to remove heat from the housing. Accordingly, housing designs for electronic devices which facilitate heat transfer may find utility, e.g., in the design and construction of electronic devices.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIG. 2A is a schematic, end-view illustration of housing for an electronic device in accordance with various examples discussed herein.

FIG. 2B is a schematic, end-view illustration of housing for an electronic device in accordance with various examples discussed herein.

FIG. 6 is a schematic, end-view illustration of a housing for an electronic device in accordance with various examples discussed herein.

FIG. 7 is a schematic, perspective illustration of electronic devices in accordance with various examples discussed herein.

DETAILED DESCRIPTION

In the following description, numerous specific details are set forth in order to provide a thorough understanding of various examples. However, various examples may be practiced without the specific details. In other instances, well-known methods, procedures, components, and circuits have not been described in detail so as not to obscure the particular examples. Further, various aspects of examples may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As described above, thin form-factor electronic devices such as solid state drives (SSDs), mobile phones, tablet computers, and the like rely on conduction to remove heat from the housing. The subject matter described herein addresses these and other issues by providing, in some aspects, an electronic device which includes a housing, at least portions of which are formed from a thermally conductive material and which includes one or more support members to support a printed circuit board. End caps for the housing include cam surfaces which, when inserted into the housing, urge the printed circuit board toward a thermally conductive surface of the housing in order to compress one or more heat generating components on the printed circuit board against the thermally conductive surface, thereby facilitating heat transfer from the one or more heat generating components on the printed circuit board. Additional features and details will be described below with reference to FIGS. 1-7.

Figure 1:
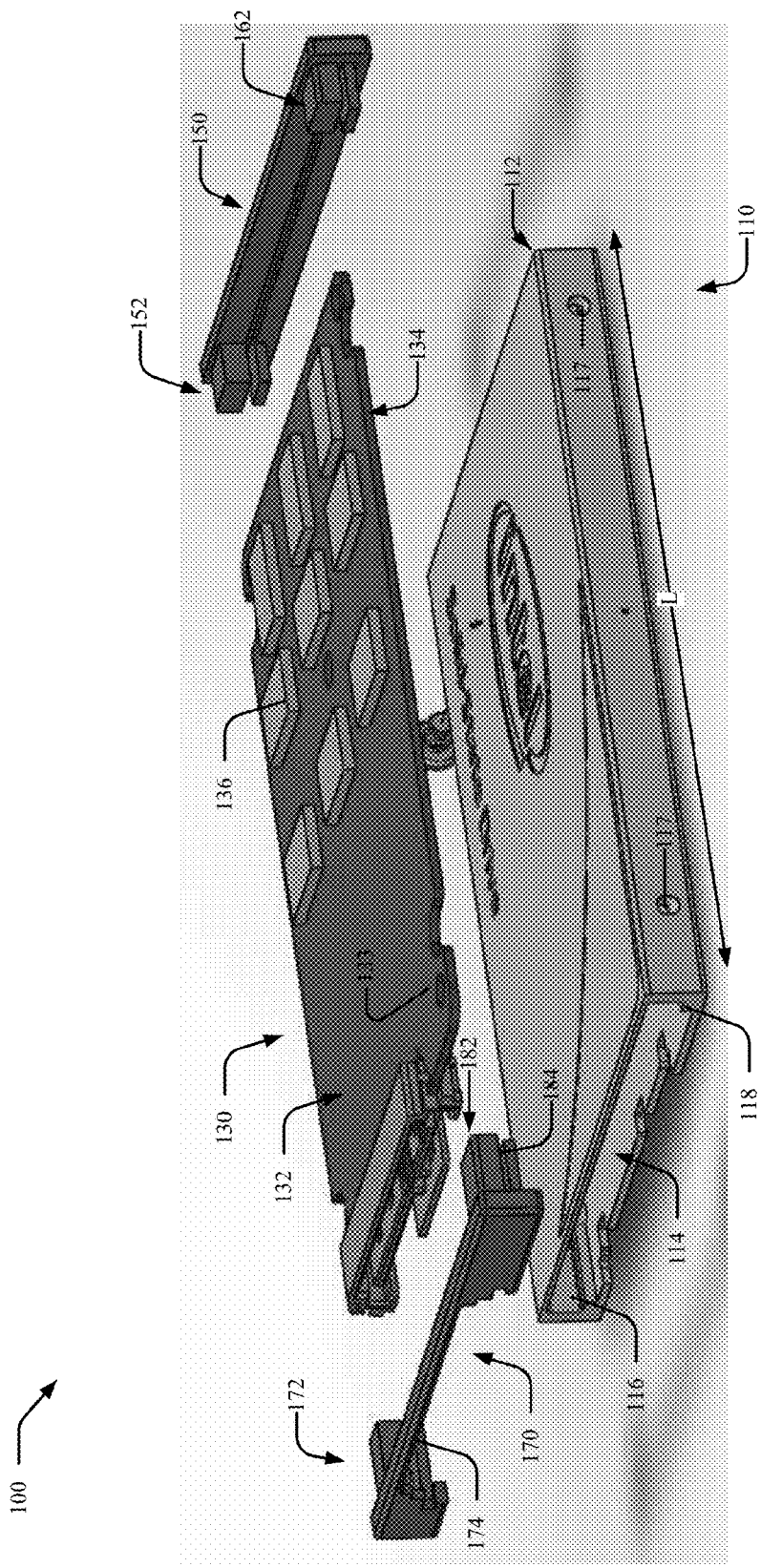
FIG. 1 is a schematic, block diagram illustration of components of an electronic device in accordance with various examples discussed herein.

Referring to FIG. 1 and FIGS. 2A-2B, an electronic device 100 comprises a housing 110 comprising a first open end 112 end and a second open end 114. In some examples the housing 110 is formed from a thermally conductive material e.g., aluminum, steel, magnesium, or alloys thereof using an extrusion process. While the specific dimensions of the housing 110 are not critical, in some examples the housing 110 may have a length, L, which measures between 30 millimeters and 300 millimeters, a width, W, which measures between 20 millimeters and 200 millimeters, and a thickness, T, which measures between 5 millimeters and 15 millimeters. In some examples portions of the housing 110 are formed to a thickness adequate to accommodate one or more minimum 3 thread depth holes 117.

The interior surface of the housing 110 is provided with a first support member 116 extending at least a portion of the distance between the first open 112 end and the second open end 114 and a second support member 118 extending at least a portion of the distance between the first open 112 end and the second open end 114. In some examples the support members 116, 118 may be formed during the extrusion process and may extend the entire length, L, of the interior of the housing 110. In other examples the support members 116, 118 may be machined into housing 110 an may extend along only a portion of the length, L, of the housing 110.

Electronic device 100 further comprises a printed circuit board 130 comprising a first surface 132, a second surface 134 and at least one heat generating component 136 disposed on the first surface 132. The heat generating component 136 may comprise one or more integrated circuits, e.g., a processor, memory module, or the like. In some examples the printed circuit board 130 has a width dimensioned to slide into the housing 110 and to be supported by the first support member 116 and/or the second support member 118.

Electronic device 100 comprises a first end cap 150 dimensioned to fit within the first open end 112 of the housing 110 and comprising a first bracket 152 having a first cam surface 154 (FIG. 3, FIG. 4) positioned to engage the second surface 134 of the printed circuit board 130 when the first end cap is inserted into the first open end 112 of the housing 110. In some examples inserting the first end cap 150 into the first open end 112 of the housing 110 causes the first cam surface 154 to urge the printed circuit board 130 in a direction which compresses the first heat generating component 136 against an interior surface 122 of the housing 110.

In some examples the first end cap 150 comprises a second bracket 162 which also has a first cam surface 164 positioned to engage the second surface 134 of the printed circuit board 130 when the first end cap is inserted into the first open end 112 of the housing 110. Inserting the first end cap 150 into the first open end 112 of the housing 110 causes the second cam surface 164 to urge the printed circuit board 130 in a direction which compresses the first heat generating component 136 against an interior surface 122 of the housing 110.

Electronic device 100 further comprises a second end cap 170 (FIG. 1) dimensioned to fit within the second open end 114 of the housing 110. The second end cap 170 comprises a first bracket 172 having a first cam surface 174 positioned to engage the second surface 134 of the printed circuit board 130 when the second end cap is inserted into the first open end 112 of the housing 110. In some examples inserting the second end cap 170 into the second open end 114 of the housing 110 causes the first cam surface 174 to urge the printed circuit board 130 in a direction which compresses the first heat generating component 136 against an interior surface 122 of the housing 110.

In some examples the second end cap 170 comprises a second bracket 182 having a first cam surface 184 positioned to engage the second surface 134 of the printed circuit board 130 when the first end cap is inserted into the first open end 112 of the housing 110. Inserting the second end cap 170 into the first open end 112 of the housing 110 causes the second cam surface 184 to urge the printed circuit board 130 in a direction which compresses the first heat generating component 136 against an interior surface 122 of the housing 110.

Figure 3:
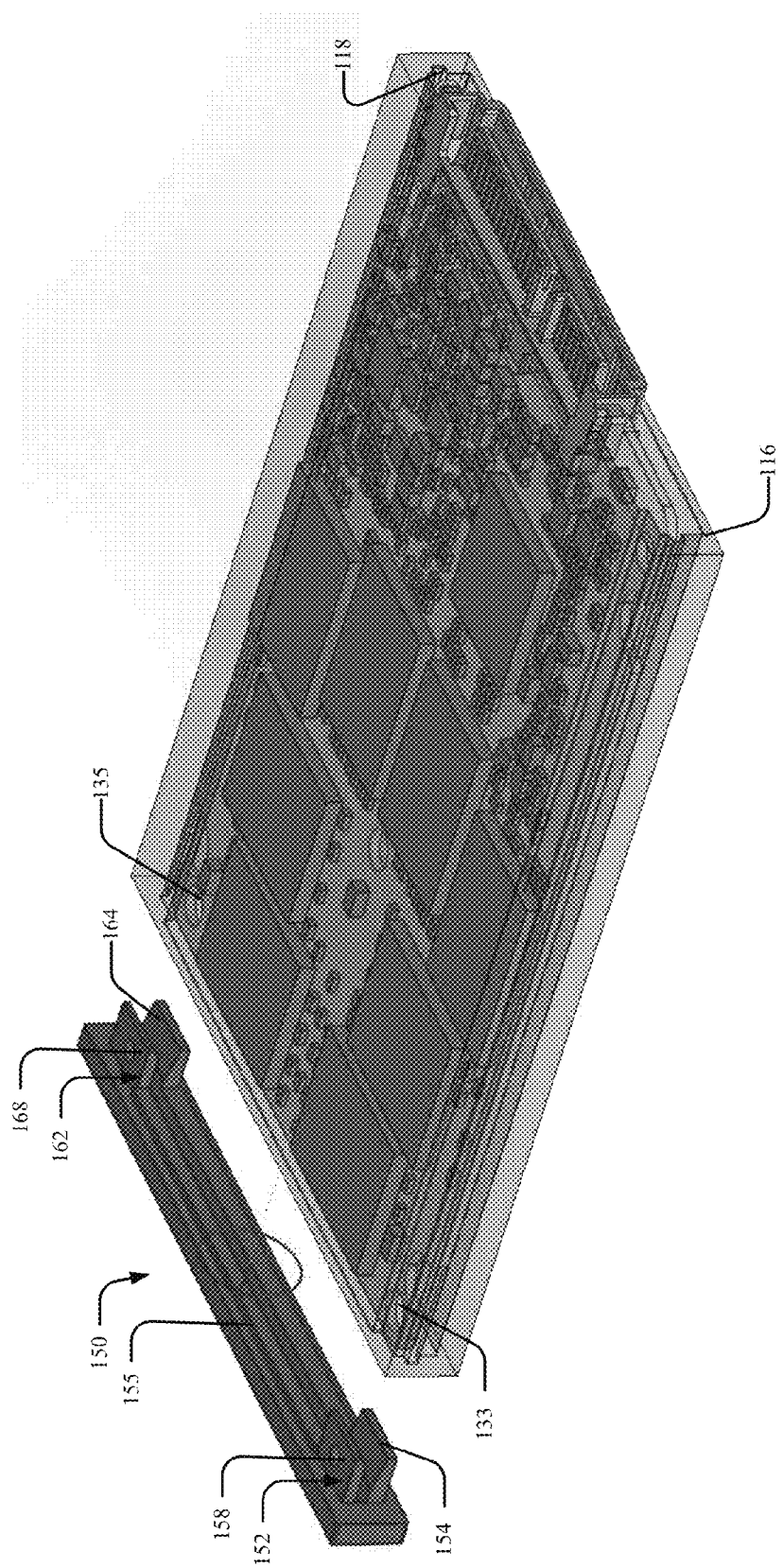
FIG. 3 is a schematic block diagram illustration of components of an electronic device in accordance with various examples discussed herein.
Figure 4:
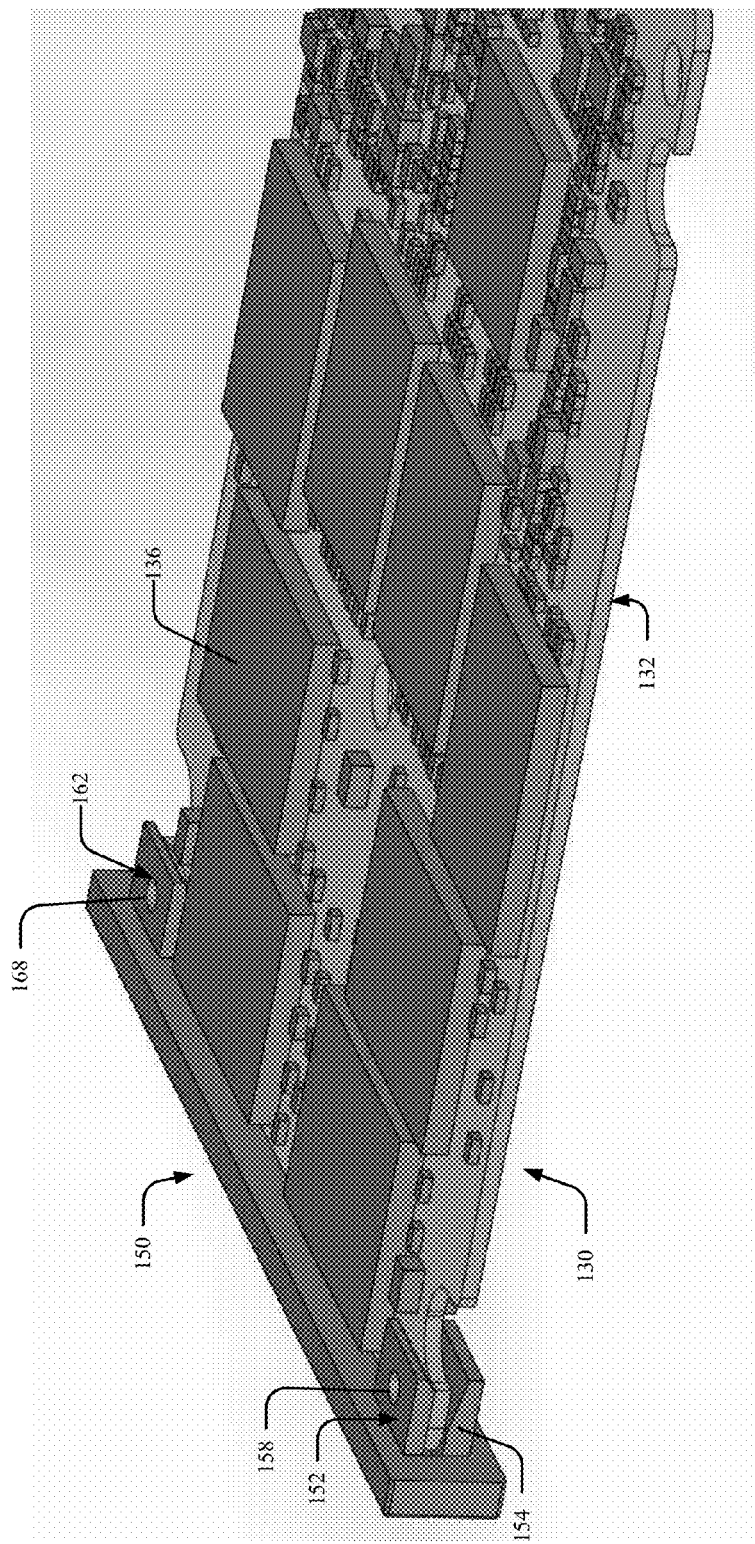
FIG. 4 is a schematic block diagram illustration of components of an electronic device in accordance with various examples discussed herein.

Referring to FIG. 3 and FIG. 4, in some examples the first bracket 150 may comprise one or more holes 158, 168 which align with holes 133, 135 in the printed circuit board 130 when the first end cap 150 is in place and the printed circuit board 130 is secured in brackets 152, 162 (FIG. 4). In such examples a polymer-based hot melt glue may be injected into holes 158, 168 to form a polymer shear pin which secures the PCB to the first end cap 150. The second end cap 170 may include similar holes to allow the PCB to be secured to the second end cap 170.

Figure 5:
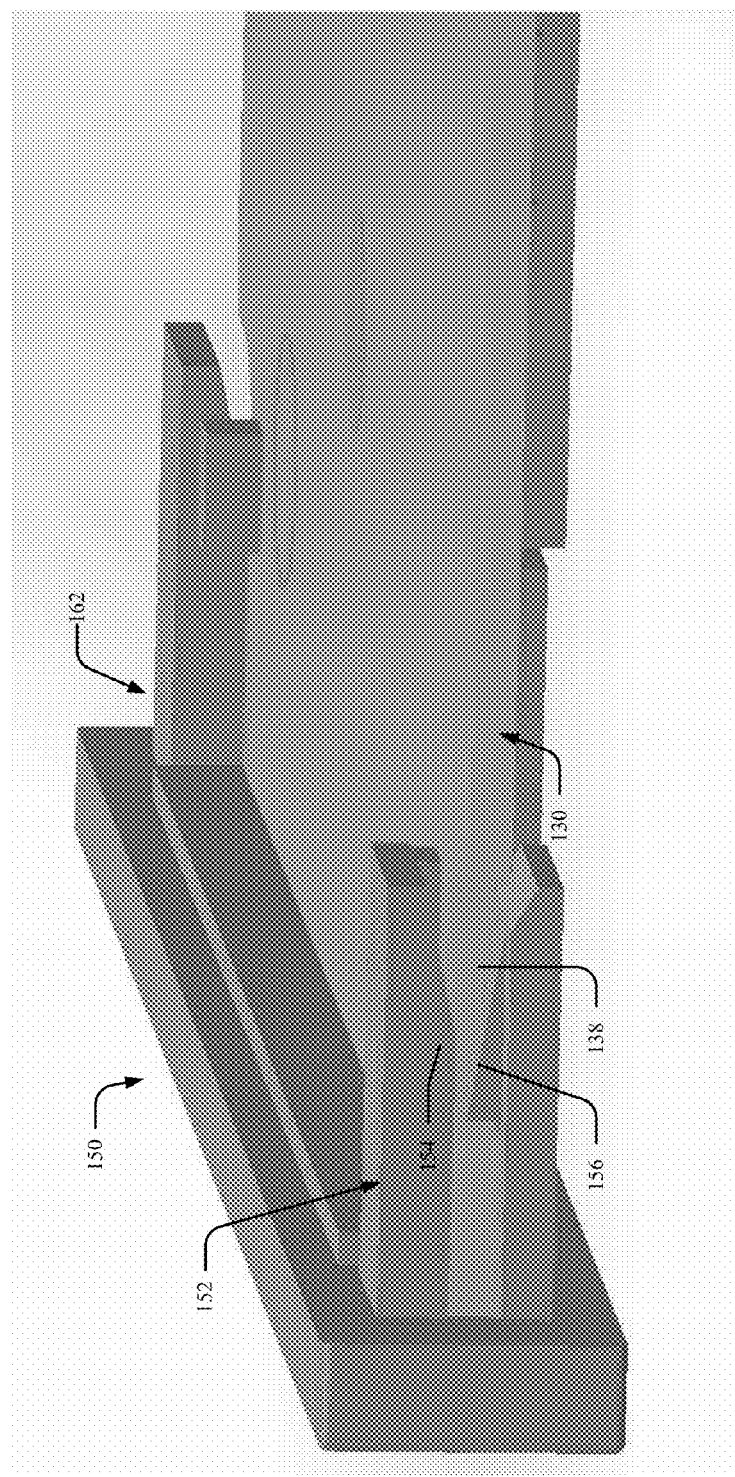
FIG. 5 is a schematic block diagram illustration of components of an electronic device in accordance with various examples discussed herein.

Referring to FIG. 5, in some examples the first bracket 150 may comprise one or more barbs 156 which align with a detent 138 in the printed circuit board 130 when the first end cap 150 is in place and the printed circuit board 130 is secured in brackets 152, 162 (FIG. 4). The second end cap 170 may include similar holes to allow the PCB to be secured to the second end cap 170.

Referring to FIGS. 6-7, in some examples the housing may include a first portion formed with a first thickness and a second portion 126 formed with a second thickness, greater than the first thickness, to provide a greater thermal conductivity to the second portion of the housing 110. The second portion 126 may be positioned proximate one or more of the heat generating components 136 in order to provide a higher degree of heat transfer from the heat generating components 136. In some examples the second portion 126 extends the entire length, L, of the housing 110.

Figure 8:
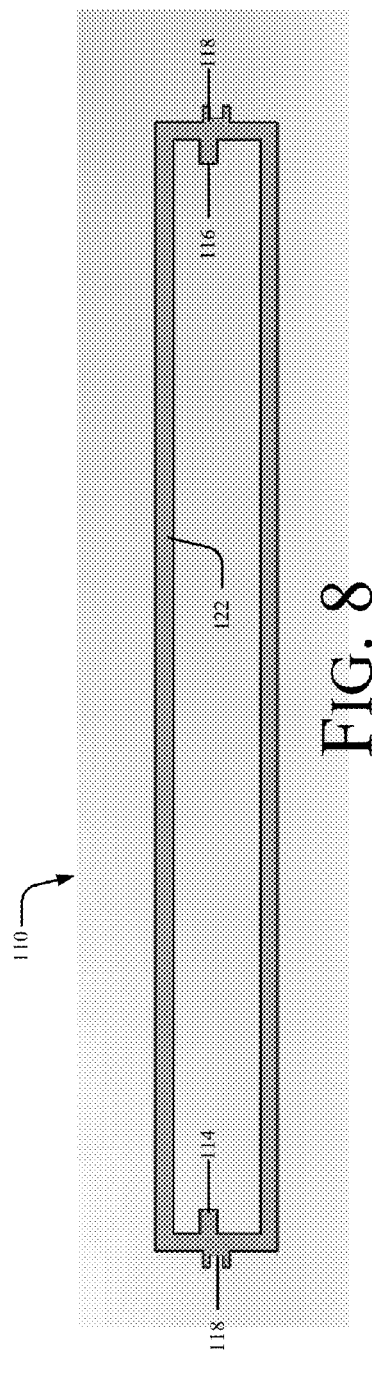
FIGS. 8-9 are a schematic, end-view illustrations of an electronic device in accordance with various examples discussed herein.

Referring to FIG. 8, in some examples the housing 110 comprises a first rail 118 formed on an exterior surface of the housing 110 and positioned to engage with an opposing rail on a host device. The housing may further comprise a second rail 118 formed on an exterior surface 120 of the housing 110 and positioned to engage with an opposing rail on a host device.

Figure 9:
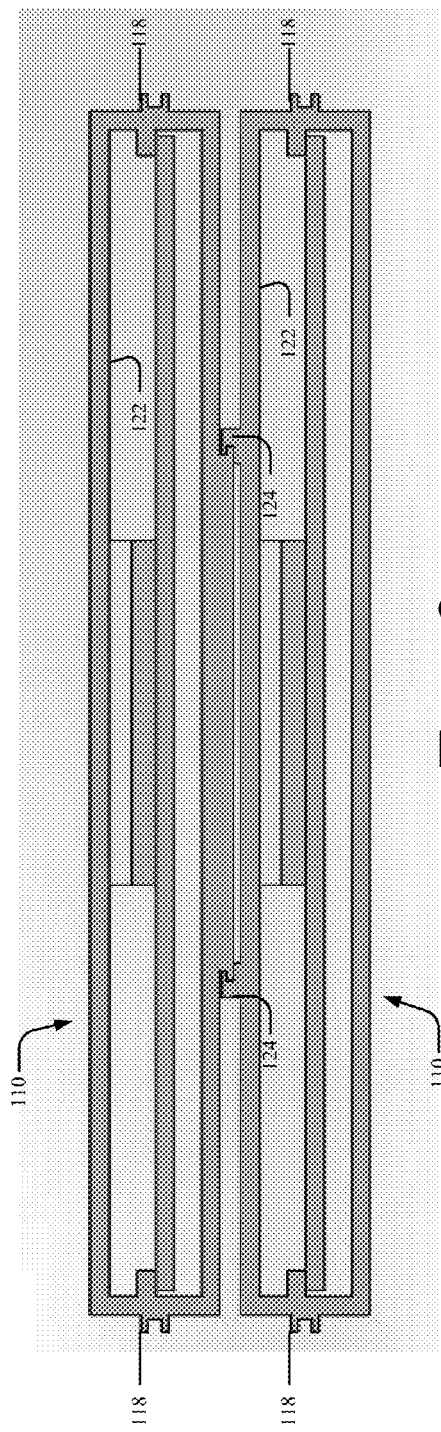

Referring to FIG. 9, in some examples the housing 110 comprises at least one bracket 124 formed on an exterior surface 120 of the housing 110 and positioned to engage with an bracket on a second electronic device 100. In some examples a thermal interface material 140 may be disposed on the first heat generating component 136.

Figure 10:
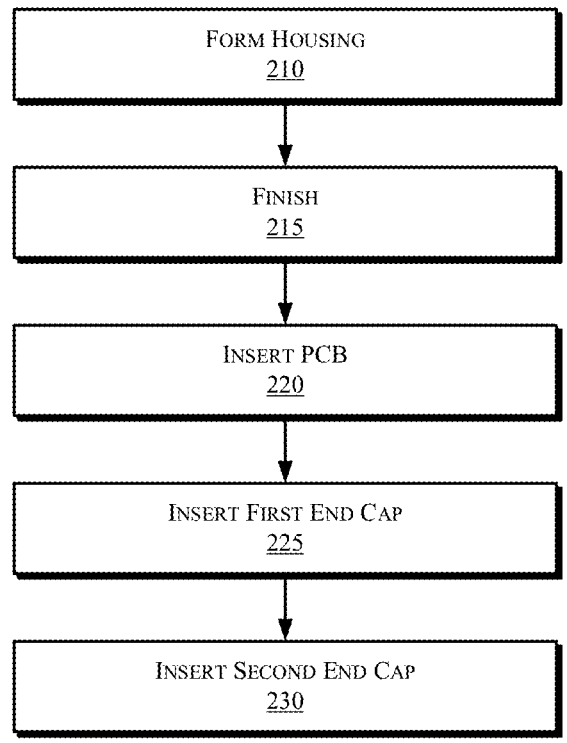
FIG. 10 is a flowchart illustrating operations in a method to make an electronic device in accordance with various examples discussed herein.

FIG. 10 is a flowchart illustrating operations in a method to make an electronic device in accordance with various examples discussed herein. Referring to FIG. 10, at operation 210 the housing 100 is from a thermally conductive material, e.g., aluminum, steel, magnesium, or alloys thereof using an extrusion process. The extrusion process yields a uni-body construction which provides a high degree of torsional stiffness for a thin form-factor housing.

At operation 215 the housing 110 is finished. In some examples the housing 110 may have one or more features machined into the surface of the housing. For example, holes 117 may be machined into the surface of housing 110.

At operation 220 the printed circuit board 130 is inserted into the housing. In some examples the printed circuit board 130 may be inserted manually such that the printed circuit board 130 rests on support member 116, 118. The support members 116, 118 define respective channels 115, 119 which are dimensioned to receive printed circuit board 130 and to prevent components on the printed circuit board 130 from striking the surface 122 of the housing while the printed circuit board 130 is being inserted.

At operation 225 the first end cap 150 is inserted into the first open end 112 of the housing 110. Inserting the first end cap causes brackets 152, 162 to engage the printed circuit board 130 and the cam surfaces 154, 164 to urge the printed circuit board 130 toward the surface 122 of the housing. In some examples the first end cap 150 may include a channel 155 to receive the printed circuit board 130. Adhesive may be applied to the channel 155 to bond the printed circuit board 130 to the channel 155. The channel 155 allows for capillary action for the adhesive.

At operation 230 the second end cap 170 is inserted into the second open end 114 of the housing 110. Inserting the second end cap causes brackets 172, 182 to engage the printed circuit board 130 and the cam surfaces 174, 184 to urge the printed circuit board 130 toward the surface 122 of the housing. In some examples the first end cap 17 may include a channel similar to channel 155 to receive the printed circuit board 130. Adhesive may be applied to the channel to bond the printed circuit board 130 to the channel. The channel allows for capillary action for the adhesive.

Example 1 is an electronic device, comprising a housing comprising a first open end end and a second open end and a first support member extending at least a portion of the distance between the first open end and the second open end, a printed circuit board comprising a first surface, a second surface and at least one heat generating component disposed on the first surface, wherein the printed circuit board has a width dimensioned to slide into the housing and to be supported by the first support member, and a first end cap dimensioned to fit within the first open end of the housing and comprising a first bracket having a first cam surface positioned to engage the second surface of the printed circuit board when the first end cap is inserted into the first open end of the housing.

In Example 2 the subject matter of Example 1 can optionally include an arrangement in which the housing comprises a second support member extending at least a portion of the distance between the first open end and the second open end.

In Example 3, the subject matter of any one of Examples 1-2 can optionally include an arrangement in which the housing is formed from a metallic material using an extrusion process.

In Example 4, the subject matter of any one of Examples 1-3 can optionally include an arrangement in which portions of the housing are formed to a thickness adequate to accommodate a minimum 3 thread depth hole.

In Example 5, the subject matter of any one of Examples 1-4 can optionally include an arrangement in which a first portion of the housing are formed with a first thickness and a second portion of the housing is formed with a second thickness, greater than the first thickness, to provide a greater thermal conductivity to the second portion of the housing.

In Example 6, the subject matter of any one of Examples 1-5 can optionally include an arrangement in which the housing comprises a first rail formed on an exterior surface of the housing and positioned to engage with an opposing rail on a host device.

In Example 7, the subject matter of any one of Examples 1-6 can optionally include an arrangement in which the housing comprises a second rail formed on an exterior surface of the housing and positioned to engage with an opposing rail on a host device.

In Example 8, the subject matter of any one of Examples 1-7 can optionally include an arrangement in which the housing comprises at least one bracket formed on an exterior surface of the housing and positioned to engage with an bracket on a second electronic device.

In Example 9, the subject matter of any one of Examples 1-8 can optionally include an arrangement in which inserting the first end cap into the first open end of the housing causes the first cam surface to urge the printed circuit board in a direction which compresses the first heat generating component against an interior surface of the housing.

In Example 10, the subject matter of any one of Examples 1-9 can optionally include an arrangement in which a thermal interface material disposed on the first heat generating component.

In Example 11, the subject matter of any one of Examples 1-10 can optionally include an arrangement in which the bracket comprises a barb positioned to mate with a detent in the printed circuit board.

In Example 12, the subject matter of any one of Examples 1-11 can optionally include an arrangement in which the first end cap dimensioned to fit within the first open end of the housing comprises a second bracket having a first cam surface positioned to engage the second surface of the printed circuit board when the first end cap is inserted into the first open end of the housing.

In Example 13, the subject matter of any one of Examples 1-12 can optionally include an arrangement in which inserting the first end cap into the first open end of the housing causes the second cam surface to urge the printed circuit board in a direction which compresses the first heat generating component against an interior surface of the housing.

In Example 14, the subject matter of any one of Examples 1-13 can optionally include an arrangement in which the bracket comprises a barb positioned to mate with a detent in the printed circuit board.

In Example 15, the subject matter of any one of Examples 1-14 can optionally include a second end cap dimensioned to fit within the second open end of the housing comprises a first bracket having a first cam surface positioned to engage the second surface of the printed circuit board when the second end cap is inserted into the first open end of the housing.

In Example 16, the subject matter of any one of Examples 1-15 can optionally include an arrangement in which inserting the second end cap into the second open end of the housing causes the first cam surface to urge the printed circuit board in a direction which compresses the first heat generating component against an interior surface of the housing.

In Example 17, the subject matter of any one of Examples 1-16 can optionally include an arrangement in which the bracket comprises a barb positioned to mate with a detent in the printed circuit board.

In Example 18, the subject matter of any one of Examples 1-17 can optionally include an arrangement in which the second end cap dimensioned to fit within the first open end of the housing comprises second bracket having a first cam surface positioned to engage the second surface of the printed circuit board when the first end cap is inserted into the first open end of the housing.

In Example 19, the subject matter of any one of Examples 1-18 can optionally include an arrangement in which inserting the second end cap into the first open end of the housing causes the second cam surface to urge the printed circuit board in a direction which compresses the first heat generating component against an interior surface of the housing.

In Example 20, the subject matter of any one of Examples 1-19 can optionally include an arrangement in which the bracket comprises a barb positioned to mate with a detent in the printed circuit board.

Reference in the specification to "one example" or "an example" means that a particular feature, structure, or characteristic described in connection with the example may be included in at least an implementation. The appearances of the phrase "in one example" in various places in the specification may or may not be all referring to the same example.

Also, in the description and claims, the terms "coupled" and "connected," along with their derivatives, may be used. In some examples, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although examples have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An electronic device, comprising:
a housing comprising a first open end and a second open end and a first support member extending at least a portion of the distance between the first open end and the second open end;
a printed circuit board comprising a first surface, a second surface and at least one heat generating component disposed on the first surface, wherein the printed circuit board has a width dimensioned to slide into the housing and to be supported by the first support member; and
a first end cap dimensioned to fit within the first open end of the housing and comprising a first bracket having a first cam surface positioned to engage the second surface of the printed circuit board when the first end cap is inserted into the first open end of the housing, wherein inserting the first end cap into the first open end of the housing causes the first cam surface to urge the printed circuit board in a direction which compresses the first heat generating component against an interior surface of the housing.

2. The electronic device of claim 1, wherein the housing comprises a second support member extending at least a portion of the distance between the first open end and the second open end.

3. The electronic device of claim 2, wherein the housing is formed from a metallic material using an extrusion process.

4. The electronic device of claim 3, wherein the portions of the housing are formed to a thickness adequate to accommodate a minimum 3 thread depth hole.

5. The electronic device of claim 3, wherein a first portion of the housing are formed with a first thickness and a second portion of the housing is formed with a second thickness, greater than the first thickness, to provide a greater thermal conductivity to the second portion of the housing.

6. The electronic device of claim 3, wherein the housing comprises a first rail formed on an exterior surface of the housing and positioned to engage with an opposing rail on a host device.

7. The electronic device of claim 3, wherein the housing comprises a second rail formed on an exterior surface of the housing and positioned to engage with an opposing rail on a host device.

8. The electronic device of claim 3, wherein the housing comprises at least one bracket formed on an exterior surface of the housing and positioned to engage with an bracket on a second electronic device.

9. The electronic device of claim 1, further comprising a thermal interface material disposed on the first heat generating component.

10. The electronic device of claim 1, wherein the bracket comprises a barb positioned to mate with a detent in the printed circuit board.

11. The electronic device of claim 1, wherein the first end cap dimensioned to fit within the first open end of the housing comprises a second bracket having a first cam surface positioned to engage the second surface of the printed circuit board when the first end cap is inserted into the first open end of the housing.

12. The electronic device of claim 1, wherein inserting the first end cap into the first open end of the housing causes the second cam surface to urge the printed circuit board in a direction which compresses the first heat generating component against an interior surface of the housing.

13. The electronic device of claim 12, wherein the bracket comprises a barb positioned to mate with a detent in the printed circuit board.

14. The electronic device of claim 1, further comprising a second end cap dimensioned to fit within the second open end of the housing comprises a first bracket having a first cam surface positioned to engage the second surface of the printed circuit board when the second end cap is inserted into the first open end of the housing.

15. The electronic device of claim 14, wherein inserting the second end cap into the second open end of the housing causes the first cam surface to urge the printed circuit board in a direction which compresses the first heat generating component against an interior surface of the housing.

16. The electronic device of claim 15, wherein the bracket comprises a barb positioned to mate with a detent in the printed circuit board.

17. The electronic device of claim 14, wherein the second end cap dimensioned to fit within the first open end of the housing comprises second bracket having a first cam surface positioned to engage the second surface of the printed circuit board when the first end cap is inserted into the first open end of the housing.

18. The electronic device of claim 17, wherein inserting the second end cap into the first open end of the housing causes the second cam surface to urge the printed circuit board in a direction which compresses the first heat generating component against an interior surface of the housing.

19. The electronic device of claim 18, wherein the bracket comprises a barb positioned to mate with a detent in the printed circuit board.

* * * * *